(12) United States Patent
Shang et al.

(10) Patent No.: US 12,021,092 B2
(45) Date of Patent: Jun. 25, 2024

(54) FLAT PANEL DETECTOR SUBSTRATE AND MANUFACTURING METHOD THEREOF, AND FLAT PANEL DETECTOR

(71) Applicants: Beijing BOE Sensor Technology Co., Ltd., Beijing (CN); BOE TECHNOLOGY GROUP CO., LTD., Beijing (CN)

(72) Inventors: Jianxing Shang, Beijing (CN); Xuecheng Hou, Beijing (CN); Guan Zhang, Beijing (CN); Huinan Xia, Beijing (CN); Xiaobin Shang, Beijing (CN)

(73) Assignees: BEIJING BOE SENSOR TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 542 days.

(21) Appl. No.: 17/264,621

(22) PCT Filed: Apr. 17, 2020

(86) PCT No.: PCT/CN2020/085304
§ 371 (c)(1),
(2) Date: Jan. 29, 2021

(87) PCT Pub. No.: WO2021/208063
PCT Pub. Date: Oct. 21, 2021

(65) Prior Publication Data
US 2022/0196858 A1 Jun. 23, 2022

(51) Int. Cl.
*G01T 1/29* (2006.01)
*H01L 27/146* (2006.01)

(52) U.S. Cl.
CPC .. *H01L 27/14603* (2013.01); *H01L 27/14612* (2013.01); *H01L 27/14658* (2013.01); *H01L 27/14692* (2013.01)

(58) Field of Classification Search
CPC ............ H01L 27/14603; H01L 27/146–14663
See application file for complete search history.

(56) References Cited

U.S. PATENT DOCUMENTS

2009/0189231 A1* 7/2009 Okada ............... H01L 27/14632
257/428
2013/0170616 A1* 7/2013 Mruthyunjaya ....... G01N 23/04
438/69

(Continued)

FOREIGN PATENT DOCUMENTS

CN 101218679 A * 7/2008 ............... G01T 1/28
EP 2869338 A1 * 5/2015 ......... H01L 27/0296

OTHER PUBLICATIONS

Machine translation, Chiori, Chinese Pat. Pub. No. CN101218679A, translation date: Aug. 5, 2023, Espacenet, all pages. (Year: 2023).*

(Continued)

*Primary Examiner* — Victoria K. Hall
(74) *Attorney, Agent, or Firm* — Dority & Manning, P.A.

(57) ABSTRACT

A flat panel detector substrate includes a base substrate, a photoelectric conversion layer, a bias signal line, and a conductive structure. The photoelectric conversion layer is located on the base substrate. The photoelectric conversion layer has a first surface proximate to the base substrate and a second surface away from the base substrate. The bias signal line is located between the photoelectric conversion layer and the base substrate. The conductive structure is located on the base substrate. One end of the conductive structure is coupled to the second surface of the photoelectric conversion layer, another end of the conductive structure (Continued)

is coupled to the bias signal line, and a portion therebetween is located beside the photoelectric conversion layer.

15 Claims, 11 Drawing Sheets

(56) References Cited

U.S. PATENT DOCUMENTS

2018/0018036 A1* 1/2018 Huang .................. G06F 3/0447
2020/0035746 A1* 1/2020 Takita ................ H01L 27/14609
2023/0395625 A1* 12/2023 Feng ................. H01L 27/14603

OTHER PUBLICATIONS

Translation, Written Opinion of International Searching Authority, International Searching Authority, International application No. PCT/CN2020/085304, dated Jan. 25, 2021, all pages. (Year: 2021).*
Translation, International Search Report, International Searching Authority, International application No. PCT/CN2020/085304, dated Jan. 25, 2021, all pages. (Year: 2021).*

* cited by examiner

FLAT PANEL DETECTOR SUBSTRATE AND MANUFACTURING METHOD THEREOF, AND FLAT PANEL DETECTOR

CROSS-REFERENCE TO RELATED APPLICATIONS

This application is a national phase entry under 35 USC 371 of International Patent Application No. PCT/CN2020/085304 filed on 17 Apr. 2020, which is incorporated herein by reference in its entirety.

TECHNICAL FIELD

The present disclosure relates to the field of flat panel detector technologies, and in particular, to a flat panel detector substrate and a manufacturing method thereof, and a flat panel detector.

BACKGROUND

Digital Radiography (DR), with its significant advantages such as faster imaging speed, more convenient operation, and higher imaging resolution, has become a main direction of digital radiography technologies. A technical core of digital radiography is an X-ray flat panel detector, which is a kind of precise and valuable device and plays a decisive role in imaging quality.

SUMMARY

In an aspect, a flat panel detector substrate is provided. The flat panel detector substrate includes: a base substrate, a photoelectric conversion layer, a bias signal line, and a conductive structure. The photoelectric conversion layer is located on the base substrate. The photoelectric conversion layer has a first surface proximate to the base substrate and a second surface away from the base substrate. The bias signal line is located between the photoelectric conversion layer and the base substrate. The conductive structure is located on the base substrate. One end of the conductive structure is coupled to the second surface of the photoelectric conversion layer, another end of the conductive structure is coupled to the bias signal line, and a portion therebetween is located beside the photoelectric conversion layer.

In some embodiments, the flat panel detector substrate further includes: a thin film transistor, a gate line and a data line. The thin film transistor is located between the photoelectric conversion layer and the base substrate. The thin film transistor includes a gate, an active layer, a source and a drain. The source is coupled to the first surface of the photoelectric conversion layer, and an orthographic projection of the active layer of the thin film transistor on the base substrate is located within an orthographic projection of the photoelectric conversion layer on the base substrate. The gate line is provided in a same layer as the gate of the thin film transistor. The gate is coupled to the gate line, and a film layer in which the gate and the gate line are located is a gate layer. The data line is provided in a same layer as the source and drain of the thin film transistor. The source is coupled to the data line, a film layer in which the source, the drain, and the data line are located is a source-drain layer, and the source-drain layer is located on a side of the gate layer away from the base substrate.

In some embodiments, the bias signal line is located in the gate layer. The flat panel detector substrate further includes: a first insulating layer and a first transfer electrode. The first insulating layer is located between the gate layer and the source-drain layer, and includes a first via. The first transfer electrode is located in the source-drain layer and is coupled to the bias signal line through the first via, and the first transfer electrode is further coupled to the second surface of the photoelectric conversion layer. The first transfer electrode forms at least a part of the conductive structure.

In some embodiments, an orthographic projection of the first transfer electrode on the base substrate overlaps an orthographic projection of the gate line on the base substrate. The flat panel detector substrate further includes a first dielectric pattern. The first dielectric pattern is located in an overlapping region of the first transfer electrode and the gate line, and is located between the gate line and the first transfer electrode. The first dielectric pattern is of at least one of a semiconductor material and an insulating material.

In some embodiments, the active layer is located between the gate layer and the source-drain layer, and the first insulating layer is located between the gate layer and the active layer. The first dielectric pattern is disposed in a same layer as the active layer.

In some embodiments, the orthographic projection of the gate line on the base substrate overlaps an orthographic projection of the data line on the base substrate. The flat panel detector substrate further includes a second dielectric pattern. The second dielectric pattern is located in an overlapping region of the gate line and the data line, and is located between the gate line and the data line. The first dielectric pattern is disposed in a same layer as the second dielectric pattern.

In some embodiments, the active layer is located between the gate layer and the base substrate. The flat panel detector substrate further includes a second insulating layer. The second insulating layer is located between the active layer and the gate layer. The first insulating layer and the second insulating layer include a source contact via and a drain contact via passing therethrough. The source is in electrical contact with the active layer through the source contact via, and the drain is in electrical contact with the active layer through the drain contact via.

In some embodiments, the first insulating layer further includes a second via. The flat panel detector substrate further includes a binding electrode. The binding electrode is located in the source-drain layer, and is coupled to the bias signal line through the second via. The binding electrode is configured to be bound with a driving chip to receive a bias signal from the driving chip and transmit the bias signal to the bias signal line.

In some embodiments, the bias signal line is located in the source-drain layer. An end of the bias signal line extends beyond a region covered by the photoelectric conversion layer, and the end of the bias signal line is coupled to the second surface of the photoelectric conversion layer from beside the photoelectric conversion layer.

In some embodiments, the flat panel detector substrate further includes a third insulating layer and a first electrode layer. The third insulating layer is located between the source-drain layer and the photoelectric conversion layer, and includes a third via. The first electrode layer is located between the third insulating layer and the photoelectric conversion layer, and includes a first electrode that is in contact with the first surface of the photoelectric conversion layer and a second transfer electrode located beside the first electrode. The first electrode and the second transfer electrode are insulated from each other, and the second transfer electrode is coupled with the bias signal line through the third via. The second transfer electrode forms at least a part of the conductive structure.

In some embodiments, the third insulating layer further includes an electrode contact via. The first electrode is coupled to the source of the thin film transistor through the electrode contact via, so that the first surface of the photoelectric conversion layer is coupled to the source.

In some embodiments, the flat panel detector substrate further includes: a second electrode, a fourth insulating layer and a third transfer electrode. The second electrode is located on a side of the photoelectric conversion layer away from the base substrate, and is in contact with the second surface of the photoelectric conversion layer. The fourth insulating layer is located on a side of the second electrode away from the base substrate, and includes a fourth via and a fifth via. The third transfer electrode is located on a side of the fourth insulating layer away from the base substrate. One end of the third transfer electrode is coupled to the second transfer electrode through the fourth via, and another end of the third transfer electrode is coupled to the second electrode through the fifth via. The third transfer electrode forms at least a part of the conductive structure.

In some embodiments, the third transfer electrode is of a transparent conductive material.

In some embodiments, an orthographic projection of an area occupied in the fourth insulating layer by the fourth via on the base substrate does not completely overlap with an orthographic projection of an area occupied in the third insulating layer by the third via on the base substrate.

In some embodiments, the orthographic projection of the photoelectric conversion layer on the base substrate at least partially overlaps with an orthographic projection of the bias signal line on the base substrate.

In some embodiments, the flat panel detector substrate further includes a third insulating layer and a first electrode layer. The third insulating layer is located between the source-drain layer and the photoelectric conversion layer. The first electrode layer is located between the third insulating layer and the photoelectric conversion layer, and includes a first electrode that is in contact with the first surface of the photoelectric conversion layer, and a bias signal line. The bias signal line and the first electrode are insulated from each other. The bias signal line is coupled with the second surface of the photoelectric conversion layer from beside the photoelectric conversion layer.

In some embodiments, an orthographic projection of a portion of the source of the thin film transistor that is coupled to the first surface of the photoelectric conversion layer on the base substrate does not overlap with the orthographic projection of the photoelectric conversion layer on the base substrate.

In some embodiments, the flat panel detector substrate has a plurality of photosensitive regions. Each photosensitive region is provided therein with the photoelectric conversion layer, the bias signal line and the conductive structure. The plurality of photosensitive regions are arranged in an array, and the bias signal line extends in a row direction or a column direction.

In another aspect, a flat panel detector is provided. The flat panel detector includes: the flat panel detector substrate as described in any one of the above embodiments; and a driving chip coupled to the flat panel detector substrate. The driving chip is configured to transmit a bias signal to the bias signal line of the flat panel detector substrate.

In yet another aspect, a manufacturing method of the flat panel detector substrate is provided. The manufacturing method includes:
providing a base substrate;
forming a bias signal line on the base substrate;
forming a photoelectric conversion layer on a side of the base substrate on which the bias signal line is formed, the photoelectric conversion layer having a first surface proximate to the base substrate and a second surface away from the base substrate, and
forming a conductive structure on the base substrate, one end of the conductive structure being coupled to the second surface of the photoelectric conversion layer, another end of the conductive structure being coupled to the bias signal line, and a portion therebetween being located beside the photoelectric conversion layer, so that the second surface of the photoelectric conversion layer is coupled with the bias signal line from beside the photoelectric conversion layer through the conductive structure.

In some embodiments, the manufacturing method of the flat panel detector substrate further includes: forming a thin film transistor before a step of forming the photoelectric conversion layer, an orthographic projection of an active layer of the thin film transistor on the base substrate being located within an orthographic projection of the photoelectric conversion layer on the base substrate.

The step of forming a thin film transistor includes:
forming a gate layer on the base substrate, the gate layer including a gate of the thin film transistor, a gate line and a bias signal line, and the gate being coupled to the gate line;
forming a first insulating layer on a side of the gate layer away from the base substrate, the first insulating layer including a first via; and
forming a source-drain layer on a side of the first insulating layer away from the base substrate, the source-drain layer including a source and a drain of the thin film transistor, a data line and a first transfer electrode, the source being coupled to the data line, and the first transfer electrode being coupled to the bias signal line through the first via.

In some embodiments, the manufacturing method further includes:
forming a third insulating layer between the step of forming the thin film transistor and the step of forming the photoelectric conversion layer, the third insulating layer including a third via; and
forming a first electrode layer on a side of the third insulating layer away from the base substrate, the first electrode layer including a first electrode that is in contact with the first surface of the photoelectric conversion layer and a second transfer electrode that is located beside the first electrode, the first electrode and the second transfer electrode being insulated from each other, and the second transfer electrode being coupled to the first transfer electrode through the third via.

In some embodiments, the method further includes:
forming a second electrode after the step of forming the photoelectric conversion layer, the second electrode being in contact with the second surface of the photoelectric conversion layer,
forming a fourth insulating layer on a side of the photoelectric conversion layer away from the base substrate, the fourth insulating layer including a fourth via and a fifth via; and forming a third transfer electrode on a side of the fourth insulating layer away from the base substrate, one end of the third transfer electrode being coupled to the second transfer electrode through the fourth via, and another end of the third transfer electrode being coupled to the second electrode through the fifth via.

The first transfer electrode, the second transfer electrode and the third transfer electrode form at least a part of the conductive structure.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products and actual processes of methods that the embodiments of the present disclosure relate to.

DETAILED DESCRIPTION

Figure 1:
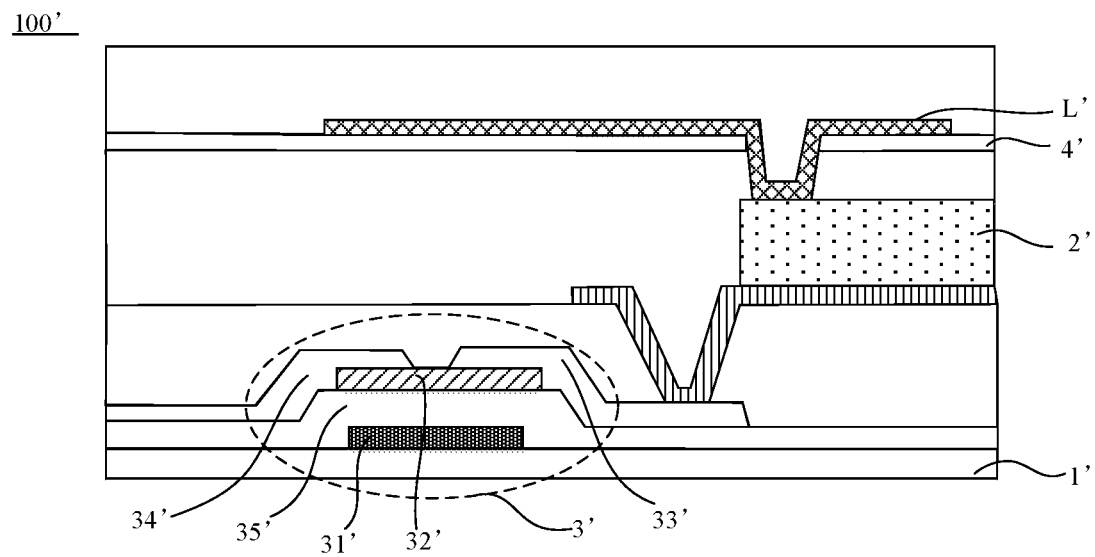
FIG. 1 is a sectional view of a flat panel detector substrate according to the related art.

Technical solutions in some embodiments of the present disclosure will be described clearly and completely below in combination with the accompanying drawings. Obviously, the described embodiments are merely some but not all embodiments of the present disclosure. All other embodiments obtained on a basis of the embodiments of the present disclosure by a person of ordinary skill in the art shall fall within the protection scope of the present disclosure.

Unless the context requires otherwise, the term "comprise" and other forms thereof such as the third-person singular form "comprises" and the present participle form "comprising" in the description and the claims are construed as open and inclusive, i.e., "including, but not limited to". In the description, the terms such as "one embodiment" "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Below, terms such as "first" and "second" are used for descriptive purposes only, and are not to be construed as indicating or implying a relative importance or implicitly indicating the number of indicated technical features. Thus, features defined with "first" and "second" may explicitly or implicitly include one or more of the features. In the description of the embodiments of the present disclosure, the term "a plurality of/the plurality of" means two or more unless otherwise specified.

In the description of some embodiments, the terms such as "coupled" and "connected" and their derivatives may be used. For example, some embodiments may be described using the term "connected" to indicate that two or more elements are in direct physical contact or electrical contact with each other. As another example, the term "coupled" may be used in the description of some embodiments to indicate that two or more components are in direct physical or electrical contact. However, the term "coupled" or "communicatively coupled" may also mean that two or more elements are not in direct contact with each other, but still cooperate or interact with each other. The embodiments disclosed herein are not necessarily limited to the content herein.

"At least one of A, B, and C" has a same meaning as "at least one of A, B, or C", and both include the following combinations of A, B, and C: only A, only B, only C, a combination of A and B, a combination of A and C, a combination of B and C, and a combination of A, B, and C.

X-ray flat panel detectors can be divided into two types according to their energy conversion manners: indirect flat panel X-ray detectors and direct flat panel X-ray detectors. In the following description, an indirect conversion X-ray flat panel detector is illustratively taken as an example.

In the related art, as shown in FIG. 1, a flat panel detector substrate 100 includes a base substrate 1', a thin film transistor 3', a photoelectric conversion layer 2', and a bias signal line L'. The bias signal line L' is located above the photoelectric conversion layer 2', and the bias signal line L' is configured to transmit a bias signal to a surface of the photoelectric conversion layer 2' away from the base substrate 1', so that the photoelectric conversion layer 2' can generate a photocurrent after being irradiated with visible light.

For example, the thin film transistor 3' includes a gate 31', an active layer 32', a source 33', a drain 34', and a first insulating layer 35' located between the gate 31' and the active layer 32'.

Since the bias signal line L' is located above the photoelectric conversion layer 2' and is made of a metal material, the bias signal line L' shields the photoelectric conversion layer. In addition, in a case where the thin film transistor 3' adopts a bottom gate structure, a light-shielding metal needs to be provided above the active layer 32" to shield the active layer 32'. For example, the bias signal line L' and the light-shielding metal are provided in a same layer. By providing the light-shielding metal, it is possible to prevent the active layer 32' from being irradiated and thus causing an increased leakage current of the thin film transistor 3' due to generation of a photocurrent. The above-mentioned light-shielding metal is located above the photoelectric conversion layer 2', therefore it also shields the photoelectric conversion layer 2'.

Due to presence of the bias signal line L' and light-shielding metal, the photoelectric conversion layer 2' is shielded and a receiving of a visible light signal by the photoelectric conversion layer 2' is affected. As a result, a filling rate of the flat panel detector substrate 100' decreases, which thereby affects a sensitivity and quantum detection efficiency of the flat panel detector substrate 100'.

On this basis, the present disclosure provides a flat panel detector substrate 100, as shown in FIGS. 2A, 2B, 3, 4, 5A, and 5B. The flat panel detector substrate 100 includes: a base substrate 1, a photoelectric conversion layer 2, a bias signal line L and a conductive structure 6.

The photoelectric conversion layer 2 is located on the base substrate 1, and the photoelectric conversion layer 2 includes a first surface S1 proximate to the base substrate 1 and a second surface S2 away from the base substrate 1.

For example, the photoelectric conversion layer includes at least one of a PIN-type photodiode, a NIP-type photodiode, or a PN-type photodiode.

The bias signal line L is located between the photoelectric conversion layer 2 and the base substrate 1.

The conductive structure 6 is located on the base substrate 1. One end of the conductive structure 6 is coupled to the second surface S2 of the photoelectric conversion layer 2, another end of the conductive structure 6 is coupled to the bias signal line L, and a portion therebetween is located beside the photoelectric conversion layer 2, so that the second surface S2 of the photoelectric conversion layer 2 is coupled to the bias signal line L from beside the photoelectric conversion layer 2 through the conductive structure 6.

In this way, the bias signal line L transmits a bias signal to the second surface S2 of the photoelectric conversion layer 2 through the conductive structure 6, and since the bias signal line L is located under the photoelectric conversion layer 2, the bias signal line L does not shield the photoelectric conversion layer 2. As a result, a receiving of a visible light signal by the photoelectric conversion layer 2 may not be affected, which improves a filling rate of the flat panel detector substrate 100, and thus improves a sensitivity and quantum detection efficiency of the flat panel detector substrate 100.

In addition, since there is no need to provide a metal layer having the biased signal line L' (as shown in FIG. 1) and a passivation layer 4' (as shown in FIG. 1) which is co-formed with the metal layer above the photoelectric conversion layer 2, an array process of making the flat panel detector substrate may be simplified.

In some embodiments, as shown in FIGS. 2B, 3, 4, 5A, and 5B, the flat panel detector substrate 100 further includes: thin film transistors 3, gate lines 4 and data lines 5. The thin film transistors 3 is located between the photoelectric conversion layer 2 and the base substrate 1, and the thin film transistor 3 includes a gate 31, an active layer 32, a source 33 and a drain 34. The source 33 is coupled to the first surface S1 of the photoelectric conversion layer 2. An orthographic projection of the active layer 32 of the thin film transistor 3 on the base substrate 1 is located within an orthographic projection of the photoelectric conversion layer 2 on the base substrate 1.

For example, the thin film transistor 3 is located between the photoelectric conversion layer 2 and the base substrate 1, and the orthographic projection of the active layer 32 of the thin film transistor 3 on the base substrate 1 is located within the orthographic projection of the photoelectric conversion layer 2 on the base substrate 1. In this way, the photoelectric conversion layer 2 may be able to shield the thin film transistors 3 and prevent a visible light from irradiating the thin film transistors 3, thereby avoiding a problem of an excessive leakage current of the thin film transistors 3.

In some embodiments, as shown in FIGS. 2B, 3, 4, and 6, the gate line 4 and the gate 31 of the thin film transistor 3 are disposed in a same layer, the gate 31 is coupled to the gate line 4, and a film layer in which the gate 31 and the gate line 4 are located is the gate layer G. As shown in FIGS. 2B, 3, 4 and 9, the data line 5 and the source 33 and drain 34 of the thin film transistor 3 are disposed in a same layer, and the source 33 is coupled to the data line 5. The film layer in which the source 33, the drain 34 and the data line 5 are located is the source-drain layer SD, and the source-drain layer SD is located on a side of the gate layer G away from the base substrate 1.

In some embodiments, the thin film transistor 3 has a bottom gate structure or a top gate structure, which is not limited in the embodiments of the present disclosure.

In some embodiments, the thin film transistor 3 is of a bottom gate structure. The active layer 32 is located between the gate layer G and the base substrate 1. The flat panel detector substrate further includes a first insulating layer 35. The first insulating layer 35 is located between the gate layer G and the active layer 32, and the active layer 32 is located between the gate layer G and the source-drain layer SD.

Figure 5A:
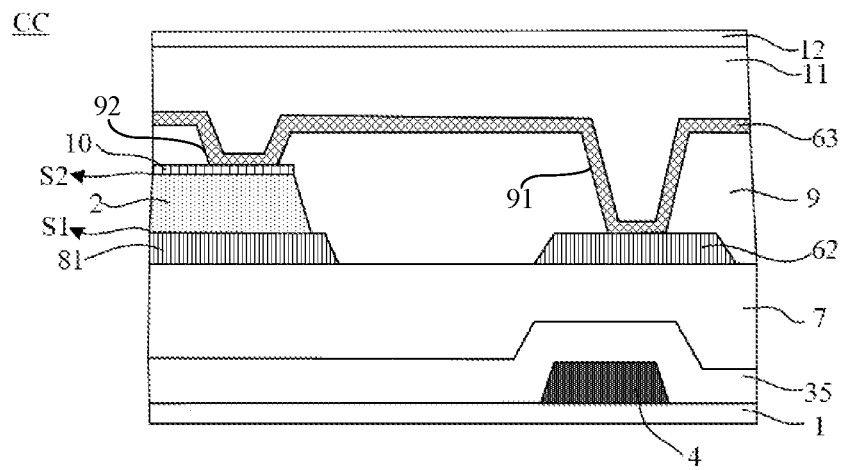
FIG. 5A is a sectional view of the flat panel detector substrate in FIG. 2B taken along line CC and FIG. 5B is a sectional view of the flat panel detector substrate in FIG. 2B taken along line DD.
Figure 5B:
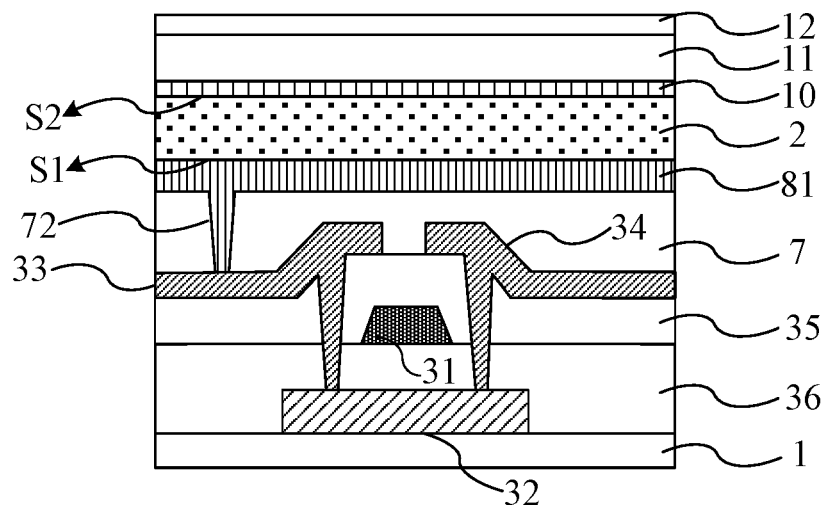

In some embodiments, as shown in FIG. 5B, the thin film transistor 3 is of a top gate structure. The flat panel detector substrate further includes a first insulating layer 35 and a second insulating layer 36. The second insulating layer 36 is located between the active layer 32 and the gate layer G, and the first insulating layer 35 and the second insulating layer 36 include a source contact via and a drain contact via passing therethrough. The source 33 is in electrical contact with the active layer 32 through the source contact via, and the drain 34 is in electrical contact with the active layer 32 through the drain contact via.

Below, the embodiments are described by taking an example in which the thin film transistor 3 has a bottom gate structure.

Figure 2A:
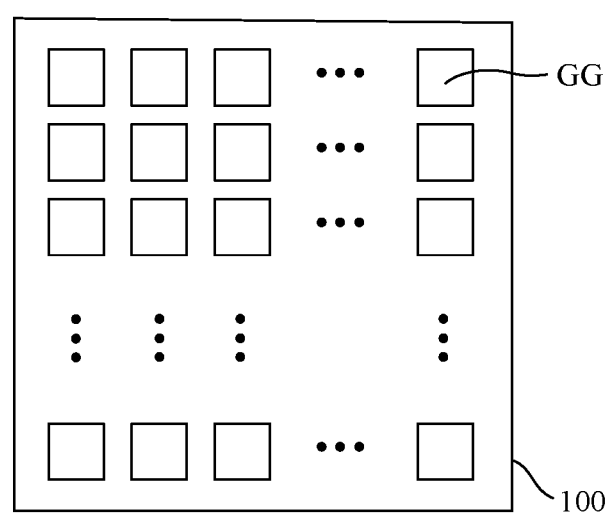
FIG. 2A is a top view of a flat panel detector substrate, according to some embodiments.
Figure 2B:
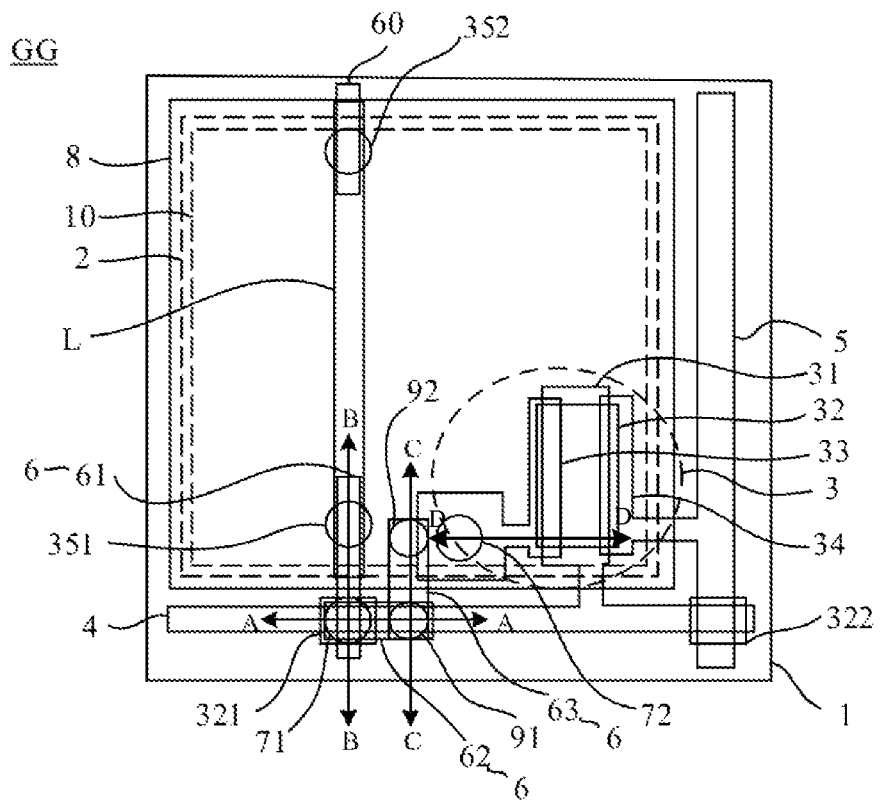
FIG. 2B is a partially enlarged view of the flat panel detector substrate shown in FIG. 2A.
Figure 3:
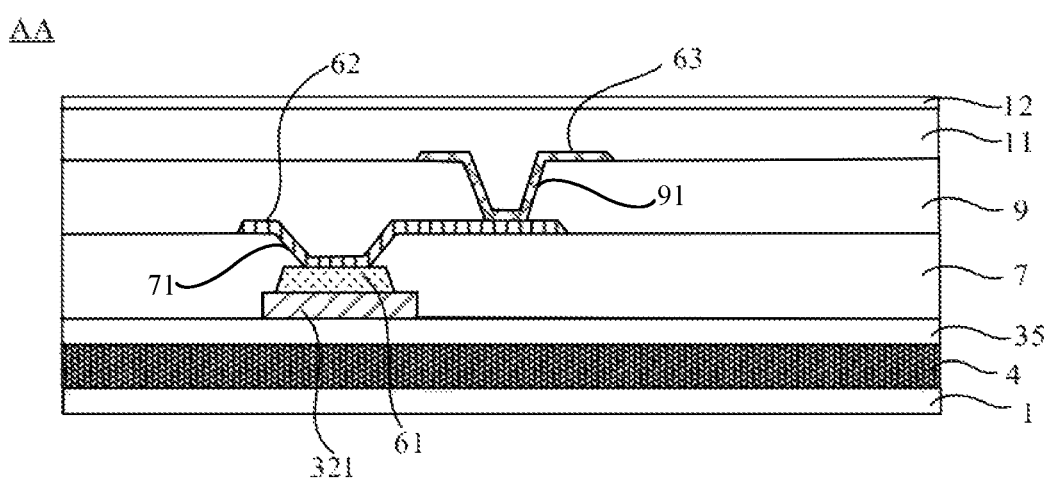
FIG. 3 is a sectional view of the flat panel detector substrate in FIG. 2B taken along line AA.
Figure 4:
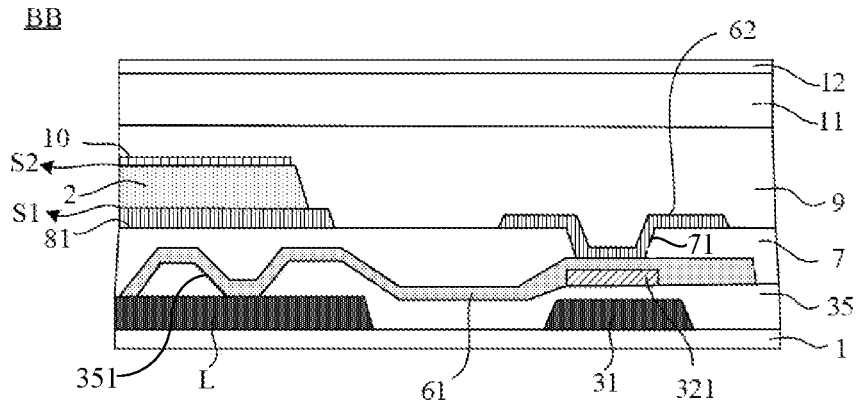
FIG. 4 is a sectional view of the flat panel detector substrate in FIG. 2B taken along line BB.
Figure 6:
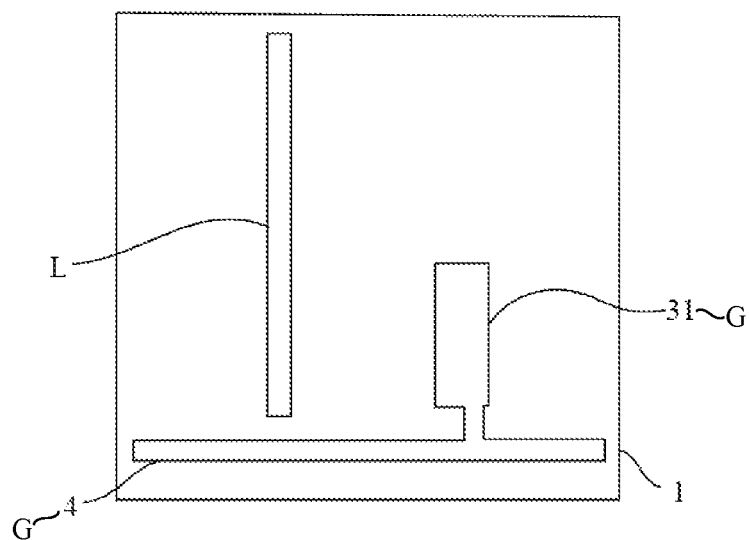
FIGS. 6 to 15 are schematic diagrams showing a manufacturing process of a flat panel detector substrate, according to some embodiments.
Figure 7:
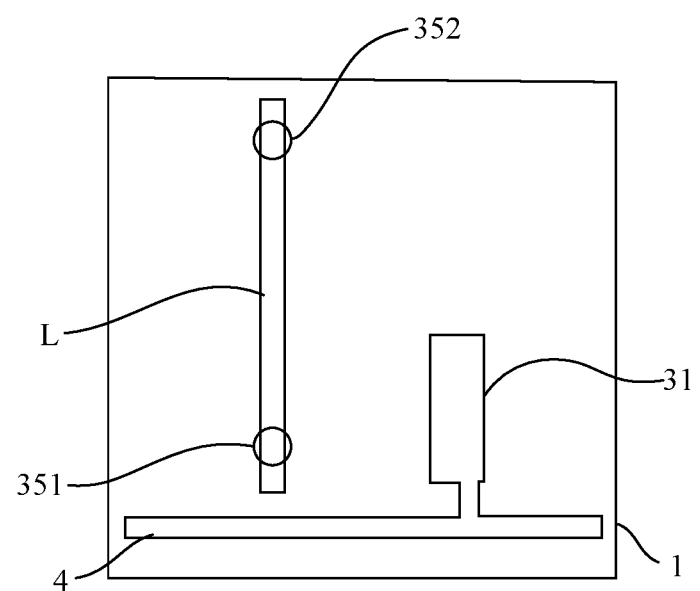

In some embodiments, as shown in FIGS. 2B, 4, and 6, the bias signal line L may be located in the gate layer G. As shown in FIGS. 2B, 4 and 7, the first insulating layer 35 includes a first via 351. As shown in FIGS. 2B, 4, 5A, 5B, and 9, the flat panel detector substrate 100 further includes a first transfer electrode 61. The first transfer electrode 61 is located in the source-drain layer SD. The first transfer electrode 61 is coupled to the bias signal life L through the first via 351, and is further coupled to the second surface S2 of the photoelectric conversion layer 2. The first transfer electrode 61 forms at least a part of the conductive structure 6.

It will be noted that here, a coupling between the first transfer electrode 61 and the second surface S2 of the photoelectric conversion layer 2 may be an indirect coupling. That is, the two are coupled through some structures, and some implementations will be given in subsequent embodiments.

Figure 8:
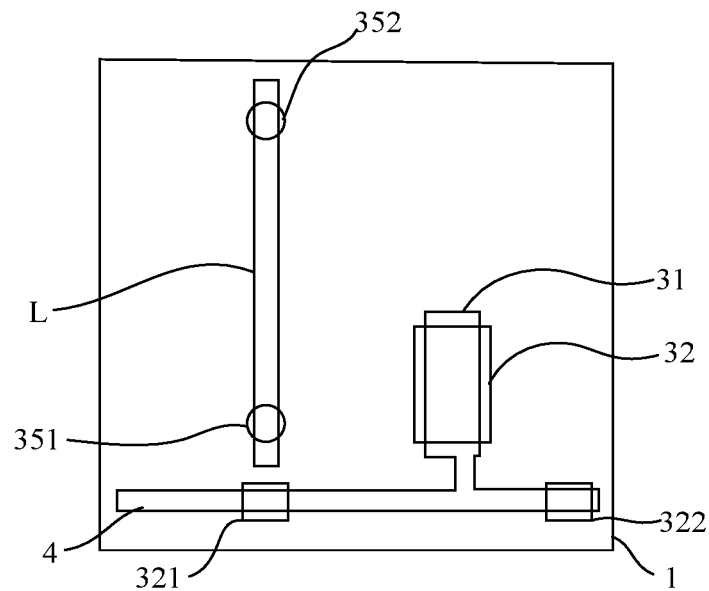
Figure 9:
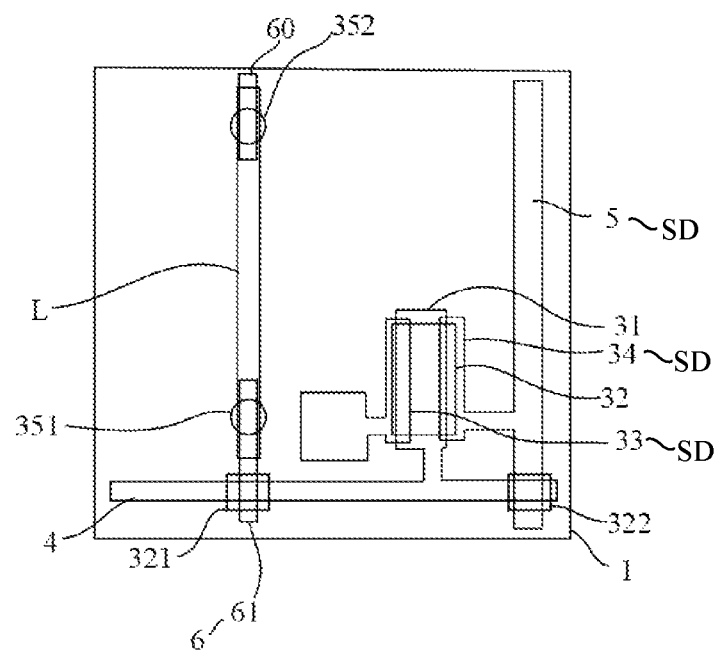

In some embodiments, as shown in FIGS. 2B and 9, an orthographic projection of the first transfer electrode 61 on the base substrate 1 overlaps an orthographic projection of the gate line 4 on the base substrate 1. As shown in FIGS. 2B, 8 and 9, the flat panel detector substrate 100 further includes: a first dielectric pattern 321 located in an overlapping region of the first transfer electrode 61 and the gate line 4. The first dielectric pattern 321 is located between the gate line 4 and the first transfer electrode 61.

For example, an area of an orthographic projection of the first dielectric pattern 321 on the base substrate 1 is greater than or equal to an area of an orthographic projection of the overlapping region of the gate line 4 and the first transfer electrode 61 on the base substrate 1.

For example, the first dielectric pattern 321 is of at least one of a semiconductor material and an insulating material. In this way, the first dielectric pattern 321 increases a dielectric constant of a dielectric material between the first transfer electrode 61 and the gate line 4, so that the first dielectric pattern 321 can reduce a parasitic capacitance between the gate line 4 and the first transfer electrode 61.

In a case where the first dielectric pattern 321 is of a semiconductor material, for example, since the active layer 32 is located between the gate layer G and the source-drain layer SD and the first insulating layer 35 is located between the gate layer G and the active layer 32, the first dielectric pattern 321 may be disposed in a same layer as the active layer 32. In this way, the first dielectric pattern 321 and the active layer 32 may be formed in a same manufacturing process, which simplifies a manufacturing process.

In some embodiments, as shown in FIGS. 2B, 8 and 9, an orthographic projection of the gate line 4 on the base substrate 1 overlaps an orthographic projection of the data line 5 on the base substrate 1. The flat panel detector substrate 100 further includes a second dielectric pattern 322, which is located in an overlapping region of the gate line 4 and the data line 5 and between the gate line 4 and the data line 5. The second dielectric pattern 322 is of at least one of a semiconductor material and an insulating material. In this way, the second dielectric pattern 322 may be able to reduce the parasitic capacitance between the gate line 4 and the data line 5.

For example, an area of an orthographic projection of the second dielectric pattern 322 on the base substrate 1 is greater than or equal to an area of an orthographic projection of the overlapping region of the gate line 4 and the data line 5 on the base substrate 1.

For example, the first dielectric pattern 321 and the second dielectric pattern 322 are disposed in a same layer. Or, the first dielectric pattern 321, the second dielectric pattern 322 and the active layer 32 are disposed in the same layer, which can simplify the manufacturing process.

In some embodiments, as shown in FIGS. 2B, 7, 8 and 9, the first insulating layer 35 further includes a second via 352. The flat panel detector substrate 100 further includes a binding electrode 60, which can be located in the source-drain layer SD and is coupled to the bias signal line L through the second via 352. The binding electrode 60 is configured to be bound with an external driving chip to receive a bias signal from the driving chip and transmit the bias signal to the bias signal line L.

In some embodiments, as shown in FIG. 2A, the flat panel detector substrate 100 has a plurality of photosensitive regions GG. As shown in FIG. 2B, each photosensitive regions GG is provided therein with a photoelectric conversion layer 2, a bias signal line L and a conductive structure 6. The plurality of photosensitive regions GG are arranged in an array, and the bias signal line L extends in a row direction or a column direction.

For example, the external driving chip transmits a bias signal to the binding electrode 60 in each photosensitive region GG column by column through a connecting line, and the binding electrode 60 transmits the bias signal to the bias signal line L in a corresponding photosensitive region through the second via 352, thereby realizing a reception and transmission of the bias signal by the binding electrode 60.

In some embodiments, the bias signal line L is located in the source-drain layer SD. An end of the bias signal line L extends beyond a region covered by the photoelectric conversion layer 2, and this end of the bias signal line L is coupled to the second surface S2 of the photoelectric conversion layer 2 from beside the photoelectric conversion layer 2. In this case, the first insulating layer 35 may not be provided with the first via 351 and the second via 352. The source-drain layers SD may be or may not be provided with the binding electrode 60, which is not limited in the embodiments of the present disclosure.

For example, in a case where the source-drain layer is not provided with the binding electrode 60, the bias signal line L is directly coupled to the driving chip, and receives bias signals directly from the driving chip.

In some embodiments, as shown in FIGS. 2B, 3, 4, 5A, 5B, and 11, the flat panel detector substrate 100 further includes a third insulating layer 7 and a first electrode layer 8. The third insulating layer 7 is located between the source-drain layer SD and the photoelectric conversion layer 2, and includes a third via 71. The first electrode layer 8 is located between the third insulating layer 7 and the photoelectric conversion layer 2.

The first electrode layer 8 includes a first electrode 81 and a second transfer electrode 62. The first electrode 81 is in contact with the first surface S1 of the photoelectric conversion layer 2. The second transfer electrode 62 is located beside the first electrode 81. The first electrode 81 and the second transfer electrode 62 are insulated from each other, and the second transfer electrode 62 is coupled to the bias signal line L through the third via 71. The second transfer electrode 62 forms at least a part of the conductive structure 6.

Herein, a coupling between the second transfer electrode 62 and the bias signal line L may be an indirect coupling. For example, in a case where the bias signal line L is located in the gate layer G, the second transfer electrode 62 is coupled with the bias signal line L through the third via 71, the first transfer electrode 61, and the first via 351.

The second transfer electrode 62 is also coupled to the second surface S2 of the photoelectric conversion layer 2.

A coupling between the second transfer electrode 62 and the second surface S2 of the photoelectric conversion layer 2 may be an indirect coupling. That is, the two are coupled through some structures, and some implementations will be given in the subsequent embodiments.

It will be noted that the first electrode 81 and the second transfer electrode 62 are provided in a same layer and insulated from each other. In this way, it may be possible to prevent the bias signal line L coupled to the second transfer electrode 62 from being coupled to the first electrode 81, and thereby ensure that the bias signal in the bias signal line L will not be transmitted to the first surface S1 of the photoelectric conversion layer 2.

Figure 11:
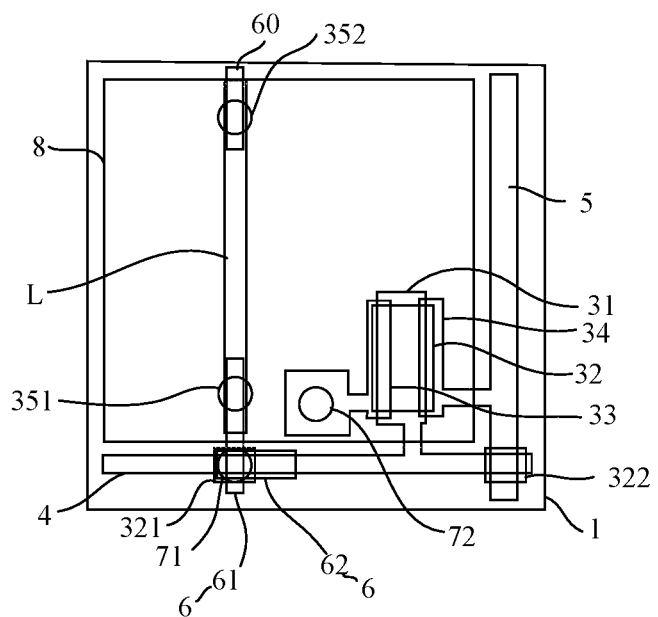

In some embodiments, as shown in FIGS. 2B and 11, the third insulating layer 7 further includes an electrode contact via 72. The first electrode 81 is coupled to the source 33 of the thin film transistor 3 through the electrode contact via 72, so that the first surface S1 of the photoelectric conversion layer 2 is coupled to the source 33.

For example, the first electrode 81 is of a metal or an alloy material; the first electrode 81 may be of a metal oxide conductive material, such as at least one of indium tin oxide (ITO), indium zinc oxide (IZO), zinc gallium oxide (GZO) or aluminum doped zinc oxide (AZO); the first electrode 81 may be of a metal nitride conductive material, such as at least one of titanium nitride (TiN), titanium oxynitride (TiON), tantalum nitride (TaN), or tantalum oxynitride (TaON), which is not limited in the embodiments of the present disclosure.

For example, the third insulating layer 7 is of at least one of resin, silicon oxide, silicon nitride and other insulating materials.

In some embodiments, an orthographic projection of a portion of the source 33 of the thin film transistor 3 that is coupled to the first surface S1 of the photoelectric conversion layer 2 on the base substrate 1 does not overlap with the orthographic projection of the photoelectric conversion layer 2 on the base substrate 1.

For example, no photoelectric conversion layer 2 is provided above the portion of the source 33 that is coupled to the first surface S1 of the photoelectric conversion layer 2.

It will be pointed out that, the portion of the source 33 that is coupled to the first surface S1 of the photoelectric conversion layer 2 has a certain height. Therefore, providing the photoelectric conversion layer 2 above the portion will result in an unevenness of the photoelectric conversion layer 2, which affects a performance of the photoelectric conversion layer 2. Therefore, by not providing the photoelectric conversion layer 2 above the portion of the source electrode 33 that is coupled to the first surface S1 of the photoelectric conversion layer 2, it may be possible to avoid adverse effects caused by the unevenness of the photoelectric conversion layer 2 and improve the performance of the photoelectric conversion layer.

In some other embodiments, the orthographic projection of the portion of the source 33 of the thin film transistor 3 that is coupled to the first surface S1 of the photoelectric conversion layer 2 on the base substrate 1 overlaps with the orthographic projection of the photoelectric conversion layer 2 on the base substrate 1, which is not limited in the embodiments of the present disclosure.

For example, the photoelectric conversion layer 2 is provided above the portion of the source 33 that is coupled to the first surface S1 of the photoelectric conversion layer 2. In this way, a laying area of the photoelectric conversion layer 2 may be increased, thereby increasing the filling rate of the flat panel detector substrate 100.

In some embodiments, as shown in FIGS. 2B, 3, 4, 5A and 15, the flat panel detector substrate 100 further includes: a fourth insulating layer 9, a second electrode 10 and a third transfer electrode 63. The second electrode 10 is located on a side of the photoelectric conversion layer 2 away from the base substrate 1, and the second electrode 10 is in contact with the second surface S2 of the photoelectric conversion layer 2. The fourth insulating layer 9 is located on a side of the second electrode 10 away from the base substrate 1, and the fourth insulating layer 9 includes a fourth via 91 and a fifth via 92.

The third transfer electrode 63 is located on a side of the fourth insulating layer 9 away from the base substrate 1. One end of the third transfer electrode 63 is coupled to the second transfer electrode 62 through the fourth via 91, and another end of the third transfer electrode 63 is coupled to the second electrode 10 that is located on the side of the photoelectric conversion layer 2 away from the base substrate 1 through the fifth via 92. The third transfer electrode 63 also forms at least a part of the conductive structure 6.

In this way, the bias signal line L is coupled to the second surface S2 of the photoelectric conversion layer 2 through the second transfer electrode 62, the third transfer electrode 63 and the second electrode 10.

For example, a distance between the fourth via 91 and the fifth via 92 in the fourth insulating layer 9 is very small. For example, a distance between a center of the fourth via 91 and a center of the fifth via 92 is less than or equal to 70 microns. This reduces a length of the third transfer electrode 63 spanning between the fourth via 91 and the fifth via 92, thereby increasing a signal transmission rate of the third transfer electrode 63.

In some embodiments, the third transfer electrode 63 and the second electrode 10 are of transparent conductive material(s). In this way, the third transfer electrode 63 and the second electrode 10 are prevented from shielding the photoelectric conversion layer 2.

For example, the third transfer electrode 63 is of a transparent conductive material. The third transfer electrode 63 and the second electrode 10 are of a same material or of different materials. For example, the third transfer electrode 63 is of at least one of indium tin oxide (ITO), indium zinc oxide (CO), zinc gallium oxide (GZO), aluminum-doped zinc oxide (AZO), or other materials.

For example, the second insulating layer 9 is of a transparent insulating material, such as resin.

In some embodiments, an orthographic projection of an area occupied in the fourth insulating layer by the fourth via 91 that is used for connecting the second transfer electrode 62 and the third transfer electrode 63 on the base substrate 1 does not overlap with an orthographic projection of an area occupied in the third insulating layer by the third via 71 on the base substrate 1.

Figure 14:
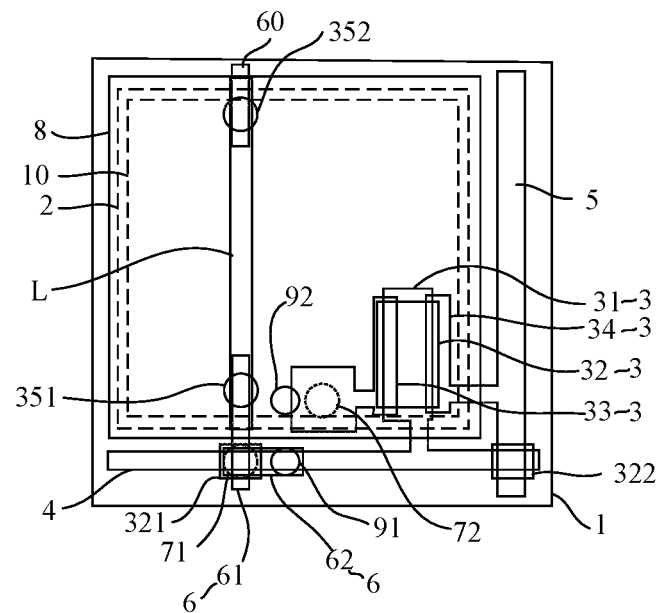

For example, as shown in FIG. 14, the orthographic projection of the area occupied in the fourth insulating layer by the fourth via 91 that is used for connecting the second transfer electrode 62 and the third transfer electrode 63 on the base substrate 1 does not overlap with the orthographic projection of the area occupied in the third insulating layer by the third via 71 on the base substrate 1.

In some other embodiments, the orthographic projection of the area occupied in the fourth insulating layer by the fourth via 91 that is used for connecting the second transfer electrode 62 and the third transfer electrode 63 on the base substrate 1 at least partially overlaps the orthographic projection of the area occupied in the third insulating layer by the third via 71 on the base substrate 1, which is not limited in the embodiments of the present disclosure.

In some embodiments, the orthographic projection of the photoelectric conversion layer 2 on the base substrate 1 at least partially overlaps with the orthographic projection of the bias signal line L on the base substrate 1. For example, in a case where the bias signal line L is located in the gate layer G (as shown in FIGS. 2B, 6 and 9) or in the source-drain layer SD, the orthographic projection of the bias signal line L on the base substrate 1 at least partially overlaps with the orthographic projection of the photoelectric conversion layer 2 on the base substrate 1. For example, the orthographic projection of the photoelectric conversion layer 2 on the base substrate 1 covers a main part of the orthographic projection of the bias signal line L on the base substrate 1, with only an end of the orthographic projection of the bias signal line L exposed.

In some embodiments, the bias signal line L may also be located in the first electrode layer 8. The bias signal line L is coupled to the second surface S2 of the photoelectric conversion layer 2 from beside the photoelectric conversion layer 2. For example, the bias signal line L is located outside a region covered by photoelectric conversion layer 2, which facilitates a coupling of the bias signal line L to the second surface S2 of the photoelectric conversion layer 2 from beside the photoelectric conversion layer 2.

For example, the first electrode 81 in the first electrode layer 8 is in contact with the first surface S1 of the photoelectric conversion layer 2, and the bias signal line L is located beside the first electrode 81. The first electrode 81 and the bias signal line L are insulated from each other. For example, in a case where the bias signal line L is located in the first electrode layer 8, the orthographic projection of the bias signal line L on the base substrate 1 overlaps with or at least partially overlaps with the orthographic projection of the gate line 4 on the base substrate 1.

In this case, the first electrode layer 8 may not be provided with the second transfer electrode 62. For example, in a case where the second transfer electrode 62 is not provided in the first electrode layer 8, the bias signal line L is directly coupled to the third transfer electrode 63 through the fourth via 91 in the fourth insulating layer 9, and coupled to the second surface S2 of the photoelectric conversion layer 2 through the third transfer electrode 63, so that the bias signal line L transmits the bias signal to the second surface S2 of the photoelectric conversion layer 2.

In some embodiments, the flat panel detector substrate 100 further includes a conductive layer. The conductive layer may be located between the source-drain layer SD and the first electrode layer 8, in which case the bias signal line L may be located in the conductive layer. The orthographic projection of the bias signal line L on the base substrate 1 does not overlap with the orthographic projection of the thin film transistor 3 on the base substrate 1, thus avoiding mutual influence of the bias signal line L and the thin film transistor 3 during signal transmission.

In this case, for example, the third insulating layer 7 is located between the conductive layer and the first electrode layer 8, and the third insulating layer 7 includes a third via 71. The first electrode layer 8 includes a first electrode 81 and a second transfer electrode 62. The first electrode 81 is in contact with the first surface S1 of the photoelectric conversion layer 2, and the second transfer electrode 62 is located beside the first electrode 81. The first electrode 81 and the second transfer electrode 62 are insulated from each other, and the second transfer electrode 62 is coupled to the bias signal line L located in the conductive layer through the third via 71.

The second transfer electrode 62 is also coupled to the second surface S2 of the photoelectric conversion layer 2.

A coupling between the second transfer electrode 62 and the second surface S2 of the photoelectric conversion layer 2 may be an indirect coupling. For example, the second transfer electrode 62 is indirectly coupled to the second surface S2 of the photoelectric conversion layer 2 through the third transfer electrode 63 and the second electrode 10, so as to realize that the bias signal line L transmits the bias signal to the second surface 32 of the photoelectric conversion layer 2.

In some embodiments, as shown in FIGS. 3, 4, 5A, and 5B, the flat panel detector substrate 100 further includes: a protective layer 11 located on a side of the photoelectric conversion layer 2 and the conductive structure 6 away from the base substrate 1. In this way, the protective layer 11 may be able to protect layer structures located on the base substrate 1, and a stability of the flat panel detector substrate 100 may be improved.

For example, the protective layer 11 is of a transparent insulating material. For example, the protective layer 11 is made of resin.

In some embodiments, as shown in FIGS. 3, 4, 5A, and 5B, the flat panel detector substrate 100 further includes: a light conversion layer 12 located on a side of the protective layer 11 away from the base substrate 1. The light conversion layer 12 is configured to convert X-ray photons into visible light photons.

For example, the light conversion layer 12 is made of cesium iodide (CsI) or gadolinium oxysulfide (GOS).

It will be noted that the phrase "disposed/provided in a same layer" herein means that film layers for forming specific patterns are formed using a same film formation process, and then a layer structure is formed through a single patterning process using a same mask. Depending on the specific patterns, a single patterning process may include multiple exposure, development or etching processes, and the specific patterns formed in the layer structure may be continuous or discontinuous, and the specific patterns may be at different heights or have different thicknesses.

In addition, in the thin film transistor 3 involved in the embodiments of the present disclosure, since the source 33 and the drain 34 in the thin film transistor 3 are generally symmetrical in structure, there is no difference between the source 33 and the drain 34 in structure. In the embodiments of the present disclosure, in order to distinguish two electrodes of the thin film transistor 3 except for the gate 31, one of the two electrodes is referred to as a source, and the other is referred to as a drain. However, those skilled in the art will understand that due to a structural interchangeability of the source and drain of the thin film transistor, connection relationships of the two electrodes can also be interchanged, which is an equivalent transformation of the above-mentioned embodiment of the present disclosure.

In addition, embodiments of the present disclosure further provide a manufacturing method of a flat panel detector substrate. Referring to FIGS. 2B to 16, the manufacturing method includes steps S100 to S300.

In S100, a base substrate 1 is provided, and a bias signal line L is formed on the base substrate 1.

For example, the bias signal line L can be provided in a same layer as other layer structures, or the bias signal line L can also be provided in a separate layer, which is not limited in the embodiments of the present disclosure.

In S200, a photoelectric conversion layer 2 is formed on a side of the base substrate 1 on which the bias signal line L is formed. The photoelectric conversion layer 2 includes a first surface S1 proximate to the base substrate 1 and a second surface S2 away from the base substrate 1.

In S300, a conductive structure 6 is formed on the base substrate 1. One end of the conductive structure 6 is coupled to the second surface S2 of the photoelectric conversion layer 2, another end of the conductive structure 6 is coupled to the bias signal line L, and a portion therebetween is located beside the photoelectric conversion layer 2, so that the second surface S2 of the photoelectric conversion layer 2 is coupled to the bias signal line L from beside the photoelectric conversion layer 2 through the conductive structure 6.

In some embodiments, the manufacturing method of the flat panel detector substrate 100 further includes: forming a thin film transistor 3 before a step of forming the photoelectric conversion layer 2. An orthographic projection of an active layer 32 of the thin film transistor 3 on the base substrate 1 is located within an orthographic projection of photoelectric conversion layer 2 on the base substrate 1.

It will be pointed out that the manufacturing process of the flat panel detector substrate 100 depends on a specific structure thereof. The manufacturing method is exemplarily described below by taking an example in which the bias signal line L is located in a gate layer G and the thin film transistor 3 is of a bottom gate structure.

Figure 17:
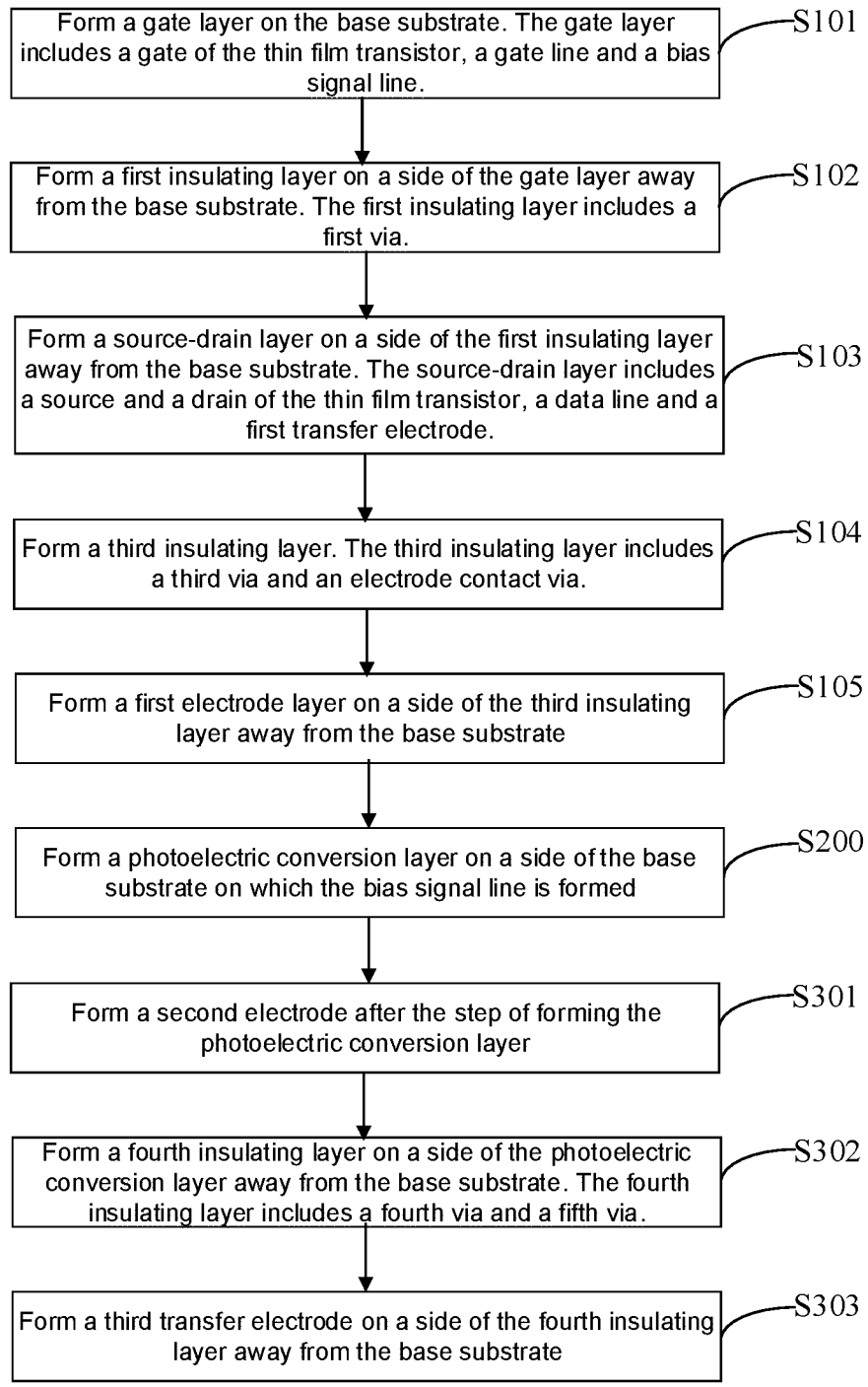
FIG. 17 is a flowchart of another manufacturing method of a flat panel detector substrate, according to some embodiments.

As shown in FIG. 17, in some embodiments, the step of forming the thin film transistor 3 includes steps S101~S103.

In S101, a gate layer G is formed on the base substrate 1. The gate layer G includes a gate 31 of the thin film transistor 3, a gate line 4 and the bias signal line L, and the gate 31 is coupled to the gate line 4.

For example, as shown in FIG. 6, the bias signal line L is located in the gate layer G. For example, the gate 31, the gate line 4 and the bias signal line L may be manufactured through a single patterning process to form the gate layer G.

In addition, the patterning process includes applying a photoresist, exposure, development, etching, and other processes. The patterning process may include multiple exposure, development and/or etching processes, and specific patterns in a formed layer structure may be continuous or discontinuous, and these specific patterns may also be at different heights or have different thicknesses. In this way, the gate 31, the gate line 4, and the bias signal line L may be fabricated at the same time, thereby simplifying a manufacturing process.

In S102, a first insulating layer 35 is formed on a side of gate layer G away from the base substrate 1. The first insulating layer 35 includes a first via 351.

For example, as shown in FIG. 7, the first insulating layer 35 is deposited on a side of the gate layer G away from the base substrate 1. The first insulating layer 35 includes a first via 351; or, the first insulating layer 35 includes a first via 351 and a second via 352. An orthographic projection of an area occupied in the first insulating layer by the first via 351 on the base substrate 1 and an orthographic projection of an area occupied in the first insulating layer by the second via 352 on the base substrate 1 at least partially overlap with an orthographic projection of the bias signal line L on the base substrate 1.

For example, as shown in FIG. 8, after forming the first insulating layer 35, an active layer 32 can be fabricated. In addition, in a case where the flat panel detector substrate 100 further includes at least one of a first dielectric pattern 321 and a second dielectric pattern 322, the first dielectric pattern 321 and the second dielectric pattern 322 may be fabricated in a same layer as the active layer 32.

In S103, a source-drain layer SD is formed on a side of the first insulating layer 35 away from the base substrate 1. The source-drain layer SD includes a source 33 and a drain 34 of the thin film transistor 3, a data line 5 and a first transfer electrode 61. The source 33 is coupled to the data line 5, and the first transfer electrode 61 is coupled to the bias signal line L through the first via 351.

For example, as shown in FIG. 9, the source 33 and the drain 34, the data line 5 and the transfer electrode 61 can be manufactured in a same patterning process to form the source-drain layer SD. In addition, in a case where the flat panel detector substrate 100 further includes a binding electrode 60, the binding electrode 60 may also be fabricated at a same time when the source-drain layer SD is being fabricated.

In some embodiments, the manufacturing method of the flat panel detector substrate 100 further includes steps S104~S105.

Figure 10:
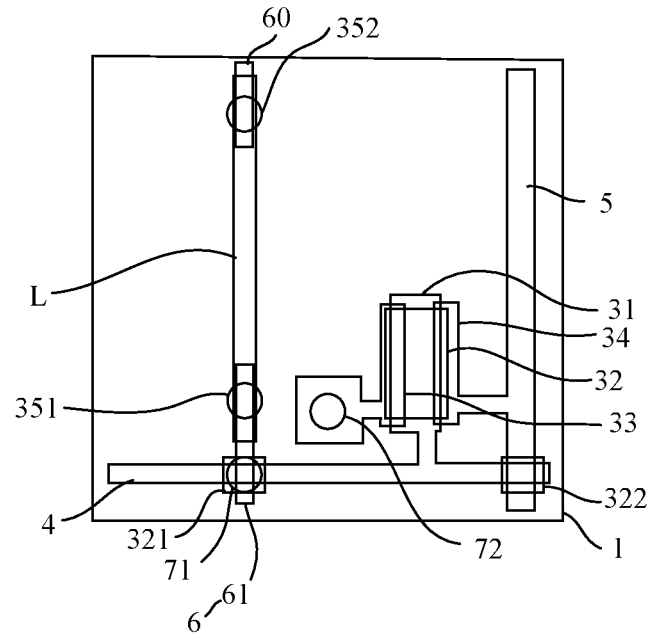

In S104, a third insulating layer 7 is formed between the step of forming the thin film transistor 3 and the step of forming the photoelectric conversion layer 2. The third insulating layer 7 includes a third via 71 and an electrode contact via 72, as shown in FIG. 10.

In S105, a first electrode layer 8 is formed on a side of the first insulating layer 7 away from the base substrate 1. The first electrode layer 8 includes a first electrode 81 that is in contact with the first surface S1 of the photoelectric conversion layer 2, and a second transfer electrode 62 that is located beside the first electrode 81. The first electrode 81 and the second transfer electrode 62 are insulated from each other, and the second transfer electrode 62 is coupled to the first transfer electrode 61 through the third via 71, as shown in FIG. 11.

In some embodiments, the manufacturing method of the flat panel detector substrate 100 further includes steps S301~S303.

Figure 12:
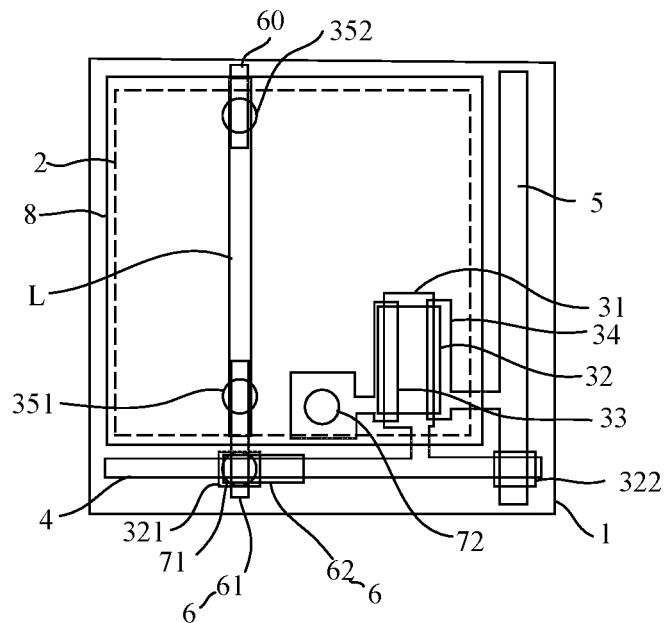
Figure 13:
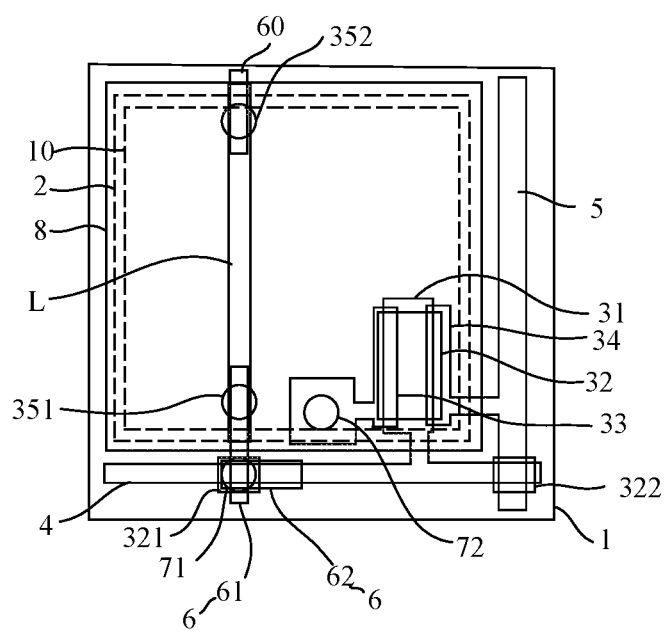

In S301, a second electrode 10 is formed after the step of forming the photoelectric conversion layer 2. The second electrode 10 is in contact with the second surface S2 of the photoelectric conversion layer 2, as shown in FIGS. 12 and 13.

In S302, a fourth insulating layer 9 is formed on a side of the photoelectric conversion layer 2 away from the base substrate 1. The fourth insulating layer 9 includes a fourth via 91 and a fifth via 92, as shown in FIG. 14.

Figure 15:
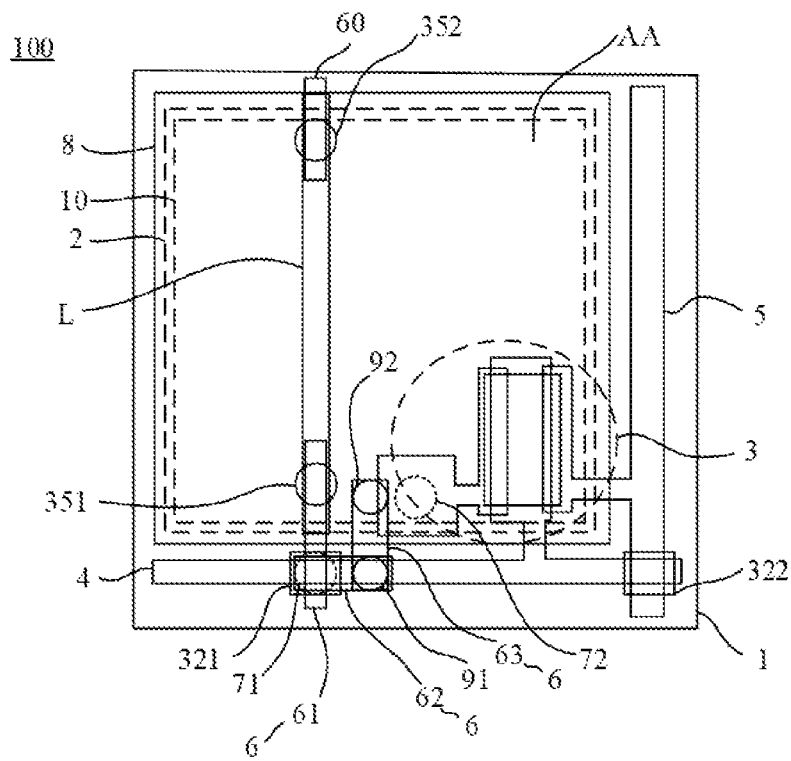
Figure 16:
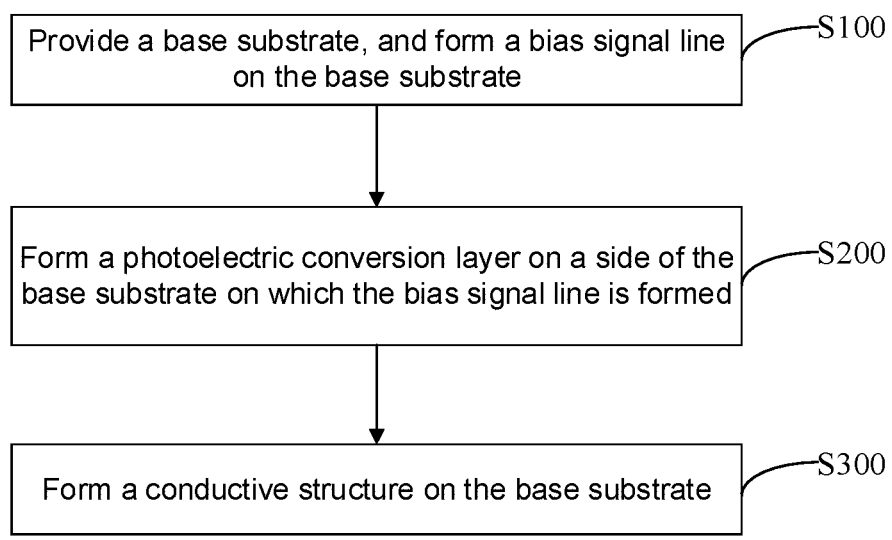
FIG. 16 is a flowchart of a manufacturing method of a flat panel detector substrate, according to some embodiments.

In S303, a third transfer electrode 63 is formed on a side of the fourth insulating layer 9 away from the base substrate 1. One end of the third transfer electrode 63 is coupled to the second transfer electrode 62 through the fourth via 91, and another end of the third transfer electrode 63 is coupled to the second electrode 10 through the fifth via 92, as shown in FIG. 15.

The first transfer electrode 61, the second transfer electrode 62 and the third transfer electrode 63 form at least a part of the conductive structure 6.

Figure 18:
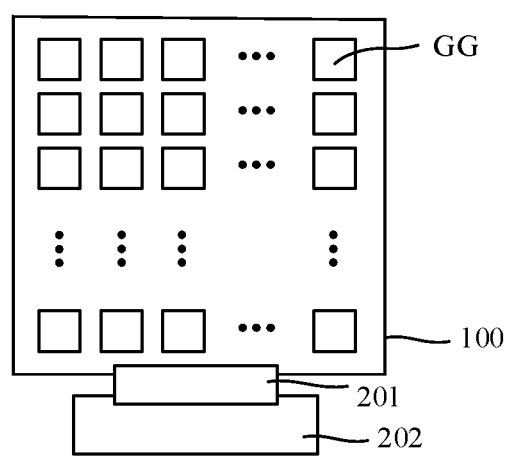
FIG. 18 is a structural diagram of a flat panel detector, according to some embodiments.

The embodiments of the present disclosure further provide a flat panel detector 200. As shown in FIG. 18, the flat panel detector 200 includes the flat panel detector substrate 100 described in any of the above embodiments and a driving chip 202.

The flat panel detector substrate 100 has a plurality of photosensitive regions GG, and each photosensitive region GG is provided therein with a photoelectric conversion layer, a bias signal line and a thin film transistor. The thin film transistor is coupled to a first surface of the photoelectric conversion layer, and the bias signal line is coupled to a second surface of the photoelectric conversion layer.

The driving chip 202 is coupled to the flat panel detector substrate 100. For example, the driving chip 202 is coupled to the flat panel detector substrate 100 through a flexible printed circuit (FPC) 201.

The driving chip 202 is configured to transmit a bias signal to the bias signal line L of the flat panel detector substrate 100, so that the bias signal can be transmitted to the second surface of the photoelectric conversion layer through the bias signal line.

In addition, the driving chip 202 is further configured to control the thin film transistor in the flat panel detector substrate 100 to be turned on, and transmit a voltage signal to the first surface of the photoelectric conversion layer that is coupled with the thin film transistor. In this way, it is possible to drive the photoelectric conversion layer to sense and collect light, such as to collect X-rays passing through the human body and output corresponding electrical signals.

Beneficial effects achieved by the flat panel detector 200 provided in the embodiments of the present disclosure are the same as those achieved by the flat panel detector substrate 100, which will not be repeated here.

The forgoing descriptions are merely specific implementations of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A flat panel detector substrate, comprising:
a base substrate;
a photoelectric conversion layer located on the base substrate, the photoelectric conversion layer having a first surface proximate to the base substrate and a second surface away from the base substrate;
a bias signal line located between the photoelectric conversion layer and the base substrate; and
a conductive structure located on the base substrate, one end of the conductive structure being coupled to the second surface of the photoelectric conversion layer, another end of the conductive structure being coupled to the bias signal line, and a portion therebetween being located beside the photoelectric conversion layer;
the flat panel detector substrate further comprising:
a thin film transistor located between the photoelectric conversion layer and the base substrate, the thin film transistor including a gate, an active layer, a source and a drain, the source being coupled to the first surface of the photoelectric conversion layer, and an orthographic projection of the active layer of the thin film transistor on the base substrate being located within an orthographic projection of the photoelectric conversion layer on the base substrate;
a gate line provided in a same layer as the gate of the thin film transistor, the gate being coupled to the gate line, and a film layer in which the gate and the gate line are located being a gate layer; and
a data line provided in a same layer as the source and drain of the thin film transistor, the source being coupled to the data line, a film layer in which the source, the drain, and the data line are located being a source-drain layer, and the source-drain layer being located on a side of the gate layer away from the base substrate;
wherein the bias signal line is located in the gate layer; and
the flat panel detector substrate further comprises:
a first insulating layer located between the gate layer and the source-drain layer, the first insulating layer including a first via; and
a first transfer electrode located in the source-drain layer, the first transfer electrode being coupled to the bias signal line through the first via, and the first transfer electrode being further coupled to the second surface of the photoelectric conversion layer;
wherein the first transfer electrode forms the other end of the conductive structure.

2. The flat panel detector substrate according to claim 1, wherein an orthographic projection of the first transfer electrode on the base substrate overlaps an orthographic projection of the gate line on the base substrate; and
the flat panel detector substrate further comprises:
a first dielectric pattern located in an overlapping region of the first transfer electrode and the gate line, the first dielectric pattern being located between the gate line and the first transfer electrode, and the first dielectric pattern being of at least one of a semiconductor material and an insulating material.

3. The flat panel detector substrate according to claim 2, wherein the active layer is located between the gate layer and the source-drain layer, and the first insulating layer is located between the gate layer and the active layer; and
the first dielectric pattern is disposed in a same layer as the active layer.

4. The flat panel detector substrate according to claim 2, wherein the orthographic projection of the gate line on the base substrate overlaps an orthographic projection of the data line on the base substrate; and
the flat panel detector substrate further comprises:
a second dielectric pattern located in an overlapping region of the gate line and the data line, the second dielectric pattern being located between the gate line and the data line;
wherein the first dielectric pattern is disposed in a same layer as the second dielectric pattern.

5. The flat panel detector substrate according to claim 1, wherein the active layer is located between the gate layer and the base substrate; and
the flat panel detector substrate further comprises:
a second insulating layer located between the active layer and the gate layer, the first insulating layer and the second insulating layer include a source contact via and a drain contact via passing therethrough, the source being in electrical contact with the active layer through the source contact via, and the drain being in electrical contact with the active layer through the drain contact via.

6. The flat panel detector substrate according to claim 1, wherein the first insulating layer further includes a second via; and
the flat panel detector substrate further comprises:
a binding electrode located in the source-drain layer, the binding electrode being coupled to the bias signal line through the second via; and
the binding electrode being configured to be bound with a driving chip to receive a bias signal from the driving chip and transmit the bias signal to the bias signal line.

7. The flat panel detector substrate according to claim 1, further comprising:
a third insulating layer located between the source-drain layer and the photoelectric conversion layer, the third insulating layer including a third via; and
a first electrode layer located between the third insulating layer and the photoelectric conversion layer, the first electrode layer including a first electrode that is in contact with the first surface of the photoelectric conversion layer and a second transfer electrode located beside the first electrode, the first electrode and the second transfer electrode being insulated from each other, and the second transfer electrode being coupled with the bias signal line through the third via; wherein the second transfer electrode forms the portion between the one end and another the other end of the conductive structure.

8. The flat panel detector substrate according claim 7, wherein the third insulating layer further includes an electrode contact via; and
the first electrode is coupled to the source of the thin film transistor through the electrode contact via, so that the first surface of the photoelectric conversion layer is coupled to the source.

9. The flat panel detector substrate according to claim 7, further comprising:

a second electrode located on a side of the photoelectric conversion layer away from the base substrate, the second electrode being in contact with the second surface of the photoelectric conversion layer;

a fourth insulating layer located on a side of the second electrode away from frog the base substrate, the fourth insulating layer including a fourth via and a fifth via; and a third transfer electrode located on a side of the fourth insulating layer away from the base substrate, one end of the third transfer electrode being coupled to the second transfer electrode through the fourth via, and another end of the third transfer electrode being coupled to the second electrode through the fifth via;

wherein the third transfer electrode forms the one end of the conductive structure.

10. The flat panel detector substrate according to claim 9, wherein the third transfer electrode is of a transparent conductive material.

11. The flat panel detector substrate according to claim 9, wherein an orthographic projection of an area occupied in the fourth insulating layer by the fourth via on the base substrate does not completely overlap with an orthographic projection of an area occupied in the third insulating layer by the third via on the base substrate.

12. The flat panel detector substrate according to claim 1, wherein the orthographic projection of the photoelectric conversion layer on the base substrate at least partially overlaps with an orthographic projection of the bias signal line on the base substrate.

13. The flat panel detector substrate according to claim 1, wherein the flat panel detector substrate has a plurality of photosensitive regions, and each photosensitive region is provided therein with the photoelectric conversion layer, the bias signal line and the conductive structure; and the plurality of photosensitive regions are arranged in an array, and the bias signal line extends in a row direction or a column direction.

14. A flat panel detector, comprising:
the flat panel detector substrate according to claim 1; and
a driving chip coupled to the flat panel detector substrate, the driving chip being configured to transmit a bias signal to the bias signal line of the flat panel detector substrate.

15. A manufacturing method of the flat panel detector substrate, comprising:
providing a base substrate;
forming a bias signal line on the base substrate;
forming a photoelectric conversion layer on a side of the base substrate on which the bias signal line is formed, the photoelectric conversion layer having a first surface proximate to the base substrate and a second surface away from the base substrate; and
forming a conductive structure on the base substrate, one end of the conductive structure being coupled to the second surface of the photoelectric conversion layer, another end of the conductive structure being coupled to the bias signal line, and a portion therebetween being located beside the photoelectric conversion layer, so that the second surface of the photoelectric conversion layer is coupled with the bias signal line from beside the photoelectric conversion layer through the conductive structure;

the flat panel detector substrate further comprising:
a thin film transistor located between the photoelectric conversion layer and the base substrate, the thin film transistor including a gate, an active layer, a source and a drain, the source being coupled to the first surface of the photoelectric conversion layer, and an orthographic projection of the active layer of the thin film transistor on the base substrate being located within an orthographic projection of the photoelectric conversion layer on the base substrate;

a gate line provided in a same layer as the gate of the thin film transistor, the gate being coupled to the gate line, and a film layer in which the gate and the gate line are located being a gate layer; and a data line provided in a same layer as the source and drain of the thin film transistor, the source being coupled to the data line, a film layer in which the source, the drain, and the data line are located being a source-drain layer, and the source-drain layer being located on a side of the gate layer away from the base substrate;

wherein the bias signal line is located in the gate layer; and the flat panel detector substrate further comprises:
a first insulating layer located between the gate layer and the source-drain layer, the first insulating layer including a first via; and
a first transfer electrode located in the source-drain layer, the first transfer electrode being coupled to the bias signal line through the first via, and the first transfer electrode being further coupled to the second surface of the photoelectric conversion layer;

wherein the first transfer electrode forms the other end of the conductive structure.

* * * * *

UNITED STATES PATENT AND TRADEMARK OFFICE
CERTIFICATE OF CORRECTION

| | |
|---|---|
| PATENT NO. | : 12,021,092 B2 |
| APPLICATION NO. | : 17/264621 |
| DATED | : June 25, 2024 |
| INVENTOR(S) | : Jianxing Shang et al. |

It is certified that error appears in the above-identified patent and that said Letters Patent is hereby corrected as shown below:

In the Claims

Column 18 (Claim 7), Line 57, "the one end and another the other end of the conductive" should be "the one end and the other end of the conductive"

Signed and Sealed this
Third Day of September, 2024

Katherine Kelly Vidal
*Director of the United States Patent and Trademark Office*